(12) United States Patent
Kim

(10) Patent No.: US 6,831,007 B2
(45) Date of Patent: Dec. 14, 2004

(54) METHOD FOR FORMING METAL LINE OF AL/CU STRUCTURE

(75) Inventor: Kil Ho Kim, Kyoungki-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 350 days.

(21) Appl. No.: 10/096,958

(22) Filed: Mar. 14, 2002

(65) Prior Publication Data

US 2002/0142605 A1 Oct. 3, 2002

(30) Foreign Application Priority Data

Mar. 28, 2001 (KR) ........................................ 2001-16307

(51) Int. Cl.[7] ........................................... H01L 21/4763
(52) U.S. Cl. ...................... 438/643; 438/644; 438/651; 438/669; 438/706; 438/720
(58) Field of Search .............................. 438/643–645, 438/651–654, 669–677, 706, 720

(56) References Cited

U.S. PATENT DOCUMENTS

| | | | |
|---|---|---|---|
| 4,803,181 A | * | 2/1989 | Buchmann et al. ......... 438/696 |
| 4,925,813 A | * | 5/1990 | Autier et al. ............... 438/718 |
| 5,091,339 A | | 2/1992 | Carey |
| 5,369,053 A | | 11/1994 | Fang |
| 5,429,988 A | * | 7/1995 | Huang et al. ............... 438/587 |
| 6,054,384 A | | 4/2000 | Wang et al. |
| 6,066,569 A | | 5/2000 | Tobben |
| 6,087,269 A | | 7/2000 | Williams |
| 6,133,635 A | | 10/2000 | Bothra et al. |
| 6,423,475 B1 | * | 7/2002 | Lyons et al. ................ 430/314 |
| 6,436,816 B1 | * | 8/2002 | Lee et al. ................... 438/643 |

* cited by examiner

Primary Examiner—Duy-Vu Deo
(74) Attorney, Agent, or Firm—Pillsbury Winthrop LLP

(57) ABSTRACT

A method for forming a metal line of an Al/Cu structure is disclosed. In a state where a first Ti/TiN layer, an Al layer, and a second Ti/TiN layer are layered, the grooves are formed by etching the upper half the Al layer using a photoresist film, which is formed on the second Ti/TiN layer by a negative patterning process, as a mask. After a third Ti/TiN layer and a Cu layer are formed in the grooves, the third Ti/TiN (buffer) layer, the second Ti/TiN layer, the Al layer, and the first Ti/TiN layer are etched using the Cu layer as a mask. Thus, the metal line having a layered structure of the first Ti/TiN layer, the Al layer, the third Ti/TiN layer, and the Cu layer is formed. In such case, since thickness of the photoresist film has decreased by half the thickness of the Al layer, the photoresist film can finely be patterned. Moreover, since the metal line is formed with the Cu layer having more excellent electrical characteristic than the Al layer, high resistant to electro-migration characteristic can be obtained and a low electrical resistance value can be obtained, thereby improving packing density of the device and its yield and reliability.

8 Claims, 5 Drawing Sheets

METHOD FOR FORMING METAL LINE OF AL/CU STRUCTURE

BACKGROUND OF THE INVENTION

1. Field of the Invention

The present invention relates to a method for forming a metal line having an Al/Cu structure, and more particularly, to a method for forming a metal line having an Al/Cu structure in which a metal line having a layered structure of a first Ti/TiN layer, an Al layer, a third Ti/TiN layer and a Cu layer is formed to improve the integration density, the manufacturing yield and reliability of the resulting semiconductor devices.

2. Background of the Related Art

A conventional method for forming a metal line will be described with reference to FIGS. 1A to 1C.

As shown in FIG. 1A, a first Ti/TiN layer 13, an Al alloy layer 15, and a second Ti/TiN layer 17 are sequentially formed on an insulating substrate 11 having a metal line contact hole (not shown).

As shown in FIG. 1B, a photoresist film is deposited on the second Ti/TiN layer 17. The photoresist film is then selectively exposed and developed by a positive patterning process to form a photoresist pattern 19 protecting those portions where metal lines will be formed.

As shown in FIG. 1C, the second Ti/TiN layer 17, the Al alloy layer 15, and the first Ti/TiN layer 13 are selectively etched using the photoresist pattern 19 as a mask, so that metal lines having a layered structure of Ti/TiN/Al/Ti/TiN are formed. The photoresist pattern 19 is then removed.

As integration density increases, the distance between adjacent metal lines becomes exceedingly small.

The metal line thickness has increased in order to form the metal line having high resistance to electro-migration and a low electrical resistance value.

As the thickness of the metal line increases, the thickness of photoresist pattern 19 also has to be increased to serve as a mask during the process of forming the metal line.

However, this conventional method for forming a metal line has several problems.

In this conventional method for forming a metal line, since a metal line is formed by etching Ti/TiN/Al/Ti/TiN layer using the photoresist pattern which is formed by the positive patterning process as a mask, the thickness of the photoresist film increases as thickness of the metal line increases due to high integration density of the device. Accordingly, it is difficult to perform the necessary micro-patterning process during the process of forming the photoresist film pattern and the yield and reliability of the resulting devices are degraded.

SUMMARY OF THE INVENTION

Accordingly, the present invention is directed to a method for forming a metal line having an Al/Cu structure that substantially overcomes one or more problems resulting from limitations and disadvantages of the prior art.

An object of the present invention is to provide a method for forming a metal line having an Al/Cu structure, in which the metal line is formed with a high resistance to electro-migration and a low electrical resistance value without increasing the thickness of the photoresist film.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for forming a metal line having an Al/Cu structure according to the present invention includes the steps of: sequentially forming a first buffer layer, a first metal layer, and a second buffer layer on an insulating substrate; depositing a photoresist film on the second buffer layer at a thin thickness that can be used as a mask to etch the first metal layer to an intermediate depth; forming a photoresist film pattern by removing the photoresist film in a region where the metal line will be formed; forming grooves by selectively etching the second buffer layer and the first metal layer using the photoresist film pattern as a mask and removing the photoresist film pattern; forming a third buffer layer on an entire surface; filling the grooves with a second metal layer having a lower electrical resistance and a higher resistance to electro-migration than the first metal layer; entirely etching the second metal layer and the third buffer layer on the second buffer layer; and forming a metal line having a layered structure of the first buffer layer, the first metal layer, the third buffer layer, and the second metal layer by selectively etching the third buffer layer, the second buffer layer, the first metal layer, and the first buffer layer using the second metal layer as a mask.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

A method for forming a metal line of an Al/Cu structure according to the preferred embodiment of the present invention will be described with reference to FIGS. 2A to 2F.

Figure 1A:
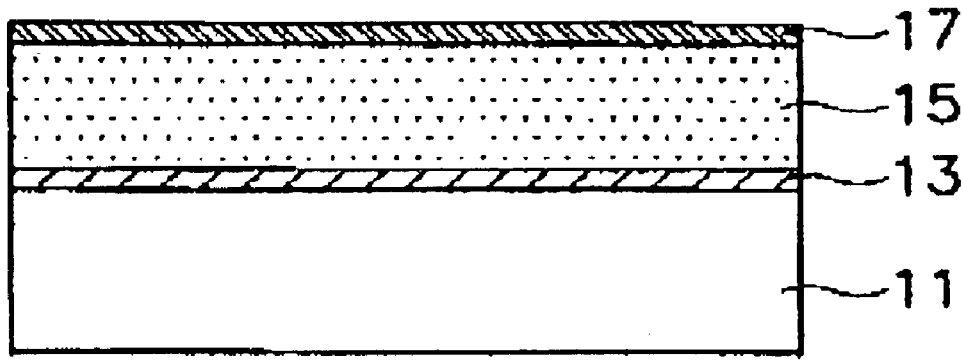
FIGS. 1A to 1C are sectional views illustrating process steps of a conventional method for forming a metal line.
Figure 1B:
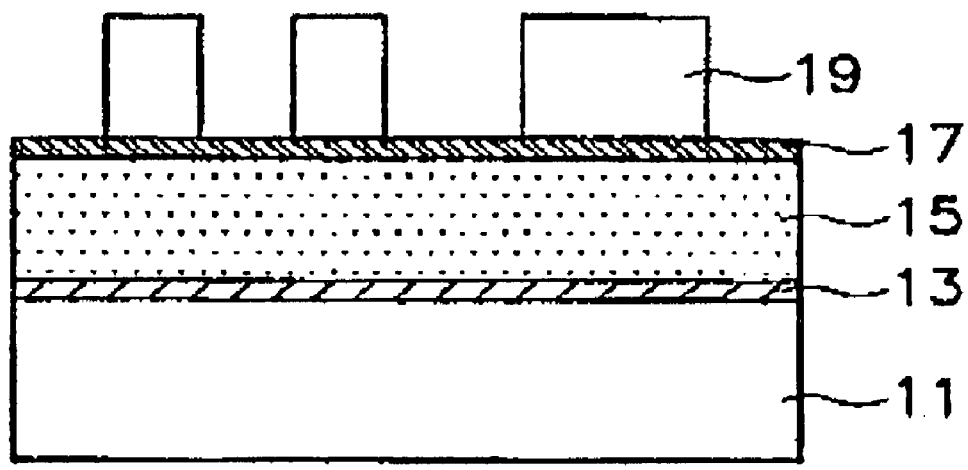
Figure 1C:
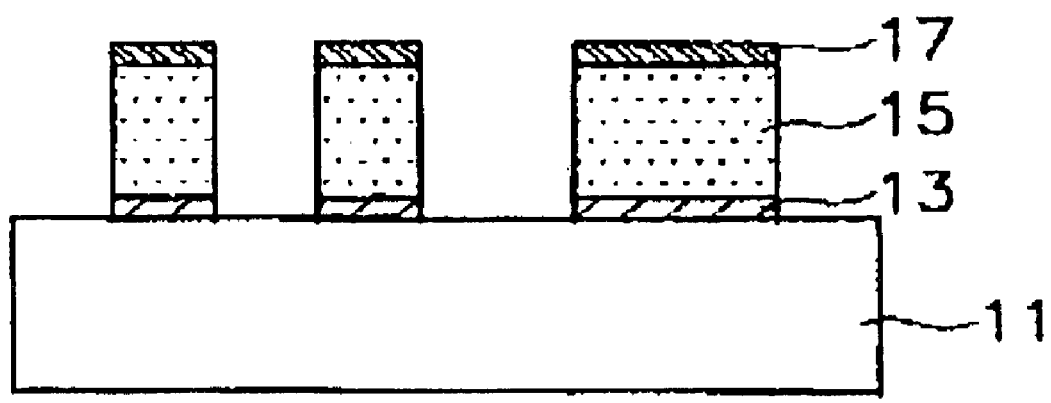
Figure 2A:
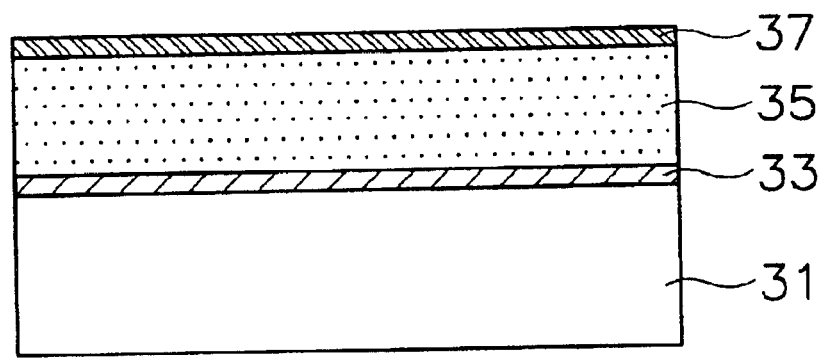
FIGS. 2A to 2F are sectional views illustrating process steps of a method for forming a metal line having an Al/Cu structure in accordance with the preferred embodiment of the present invention.

As shown in FIG. 2A, a first Ti/TiN layer 33, an Al alloy layer 35, and a second Ti/TiN layer 37 are sequentially formed on an insulating substrate 31 having a metal line contact hole (not shown).

The first Ti/TiN layer 33 and the second Ti/TiN layer 37 preferably have a thickness of 100 Å to 1000 Å. The first Ti/TiN layer 33 serves as an adhesive film between the insulating substrate 31 and the Al alloy layer 35 and as a diffusion barrier film that prevents the Al alloy layer 35 from diffusing into the insulating substrate 31.

The Al alloy layer 35 preferably has a thickness of 4000 Å to 8000 Å and is alloyed with containing 0.5% to 0.2% of Cu.

Figure 2B:
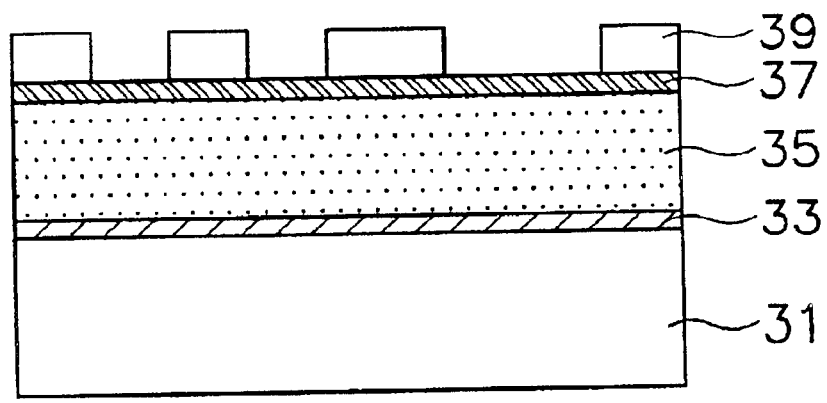

As shown in FIG. 2B, a photoresist film is deposited on the second Ti/TiN layer 37. The photoresist film is then selectively exposed and developed by a negative patterning process to form a photoresist pattern 39 on that portion where a metal line will be formed.

The second Ti/TiN layer 37 serves as an anti-reflection coating during the exposure process of the photoresist film.

The photoresist film is thinly deposited, so that half the thickness of the Al alloy layer 35 can be etched using the photoresist pattern 39 as an etch mask.

Figure 2C:
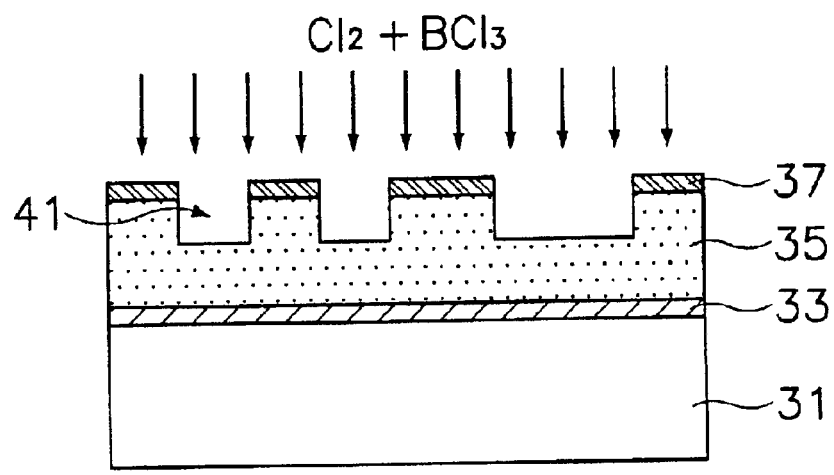

As shown in FIG. 2C, the second Ti/TiN layer 37 is selectively etched using the selectively exposed and developed photoresist pattern 39 as a mask.

The Al alloy layer 35 is dry etched using plasma in which $Cl_2+BCl_3$ are activated, so that a plurality of grooves 41 are formed. The photoresist pattern 39 is then removed.

Here, during the etching process for forming grooves, the Al alloy layer 35 is etched so that the depth of the groove is half the thickness of the Al alloy layer 35.

Figure 2D:
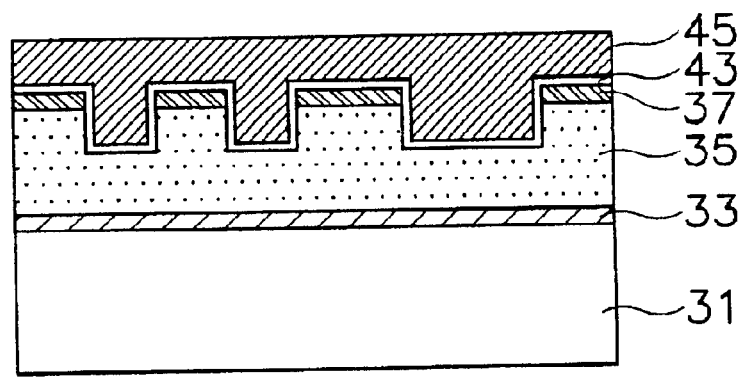

As shown in FIG. 2D, a third Ti/TiN layer 43 and a Cu layer 45 are sequentially formed on the second Ti/TiN layer 37 including the grooves 41.

Figure 2E:
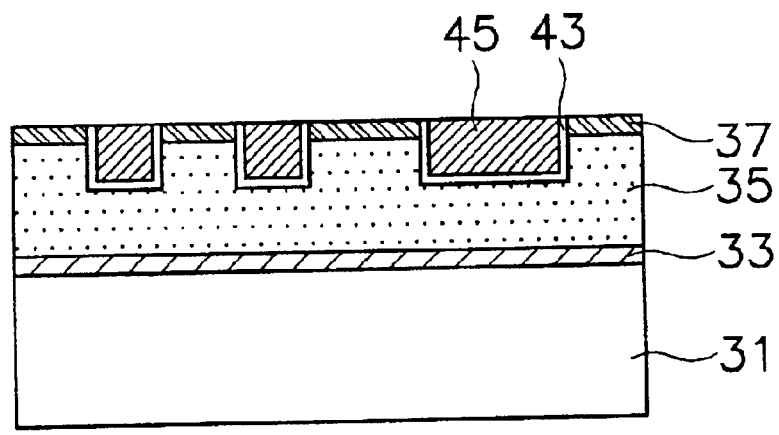

As shown in FIG. 2E, the Cu layer 45 and the third Ti/TiN layer 43 are etched by a chemical mechanical polishing (CMP) process using the second Ti/TiN layer 37 as an etch end, so that the Cu layer 45 and the third Ti/TiN layer 43 remain in the grooves 41.

Figure 2F:
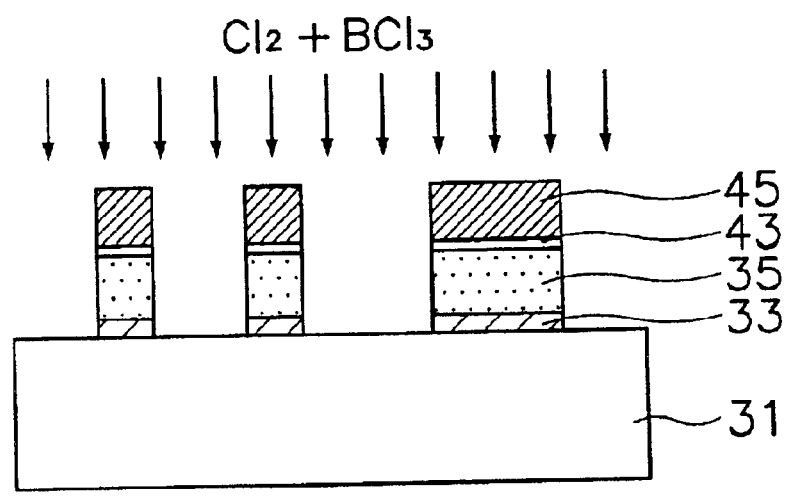

As shown in FIG. 2F, the third Ti/TiN layer 43, the second Ti/TiN layer 37, the Al alloy layer 35, and the first Ti/TiN layer 33 are dry etched using plasma in which $Cl_2+BCl_3$ are activated, to form a metal line having a layered structure of Ti/TiN/Al/Ti/TiN/Cu.

The Cu layer 43 can be used as a hard mask during the dry etching process using the plasma in which $Cl_2+BCl_3$ are activated, since the Cu layer 43 has high resistance to $Cl_2+BCl_3$ plasma.

Furthermore, since Cu is twice as conductive and is more resistant to electro-migration than Al, the metal line having a layered structure of Ti/TiN/Al/Ti/TiN/Cu can be used in a semiconductor chip which requires high performance.

As aforementioned, the method for forming a metal line of an Al/Cu structure has the following advantages.

In a state where the first Ti/TiN layer, the Al layer, and the second Ti/TiN layer are layered, the grooves are formed by selectively etching the upper half the Al layer using the photoresist pattern formed on the second Ti/TiN layer by the negative patterning process as a mask. After the third Ti/TiN layer and the Cu layer are formed in the grooves, the third Ti/TiN (buffer) layer, the second Ti/TiN layer, the Al layer, and the first Ti/TiN layer are etched using the Cu layer as a mask. Thus, the metal line having a layered structure of the first Ti/TiN layer, the Al layer, the third Ti/TiN layer, and the Cu layer is formed. In this process, because the thickness of the photoresist film has been decreased by about 50%, the photoresist film can be finely patterned. Moreover, because the metal line is formed with a Cu layer that provides improved electrical characteristic when compared with an Al layer, a combination of high resistance to electro-migration and a low electrical resistance value can be obtained, thereby improving packing density, yield, and reliability of the resulting devices.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method for forming a metal line of an Al/Cu structure, the method comprising the steps of:

sequentially forming a first buffer layer, a first metal layer, and a second buffer layer on an insulating substrate;

forming grooves by selectively etching the second buffer layer and the first metal layer in a region where the metal line will be formed;

forming a third buffer layer on an entire surface;

filling the grooves with a second metal layer having a lower electrical resistance and a higher resistance to electro-migration characteristic than the first metal layer;

entirely etching the second metal layer and the third buffer layer on the second buffer layer; and forming a metal line having a layered structure of the first buffer layer, the first metal layer, the third buffer layer, and the second metal layer by selectively etching the third buffer layer, the second buffer layer, the first metal layer and the first buffer layer using the second metal layer as a mask.

2. The method of claim 1, wherein the first metal layer is formed of an Al alloy layer and the second metal layer is formed of a Cu layer.

3. The method of claim 2, wherein the Al alloy layer is formed of alloy layer containing Al and 0.5% to 2.0% of Cu.

4. The method of claim 1, wherein the first, second and third buffer layers are formed of Ti/TiN.

5. A method for forming a metal line of an Al/Cu structure, the method comprising the steps of:

sequentially forming a first buffer layer, a first metal layer, and a second buffer layer on an insulating substrate;

depositing a photoresist film on the second buffer layer at a thin thickness that can be used as a mask to etch the first metal layer by an intermediate depth;

forming a photoresist film pattern by removing the photoresist film in a region where the metal line will be formed;

forming grooves by selectively etching the second buffer layer and the first metal layer using the photoresist film pattern as a mask and removing the photoresist film pattern;

forming a third buffer layer on an entire surface;

filling the grooves with a second metal layer having a lower electrical resistance and a higher resistance to electro-migration characteristic than the first metal layer;

entirely etching the second metal layer and the third buffer layer on the second buffer layer; and forming a metal line having a layered structure of the first buffer layer, the first metal layer, the third buffer layer, and the second metal layer by selectively etching the third buffer layer, the second buffer layer, the first metal layer, and the first buffer layer using the second metal layer as a mask.

6. The method of claim 5, wherein the first metal layer is formed of an Al alloy layer and the second metal layer is formed of a Cu layer.

7. The method of claim 6, wherein the Al alloy layer is formed of alloy layer containing Al and 0.5% to 2.0% of Cu.

8. The method of claim 5, wherein the first, second and third buffer layers are formed of Ti/TiN.

* * * * *